United States Patent
Adachi et al.

(10) Patent No.: US 9,966,730 B2
(45) Date of Patent: May 8, 2018

(54) SURFACE-EMITTING LASER APPARATUS AND MANUFACTURING METHOD THEREOF

(71) Applicants: Kazuhiko Adachi, Miyagi (JP); Naoto Jikutani, Miyagi (JP)

(72) Inventors: Kazuhiko Adachi, Miyagi (JP); Naoto Jikutani, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 155 days.

(21) Appl. No.: 14/809,745

(22) Filed: Jul. 27, 2015

(65) Prior Publication Data

US 2016/0043528 A1 Feb. 11, 2016

(30) Foreign Application Priority Data

Aug. 11, 2014 (JP) .................................. 2014-163639
Oct. 10, 2014 (JP) .................................. 2014-209081

(51) Int. Cl.
*G02B 3/08* (2006.01)
*H01S 5/022* (2006.01)
(Continued)

(52) U.S. Cl.
CPC ........ *H01S 5/02288* (2013.01); *G02B 3/0056* (2013.01); *G02B 7/008* (2013.01);
(Continued)

(58) Field of Classification Search
CPC .. H01S 5/02288; H01S 5/423; H01S 5/02276; H01S 5/02272; G02B 3/0056;
(Continued)

(56) References Cited

U.S. PATENT DOCUMENTS 6,975,663 B2 12/2005 Sekiya et al.
7,245,647 B2 7/2007 Jikutani et al.
(Continued)

FOREIGN PATENT DOCUMENTS

JP 2002-026452 1/2002
JP 2004-288713 10/2004
(Continued)

*Primary Examiner* — Alicia M Harrington
(74) *Attorney, Agent, or Firm* — Cooper & Dunham LLP

(57) ABSTRACT

A surface-emitting laser apparatus includes a surface-emitting laser substrate; a microlens substrate; and an adhesion agent. The surface-emitting laser substrate includes a semiconductor substrate; and a surface-emitting laser and plural first adhesion fixing regions formed on a first face of the semiconductor substrate. The microlens substrate includes a microlens configured to receive light emitted by the surface-emitting laser; plural pier portions protruding toward a side of the first face of the semiconductor substrate; and plural second adhesion fixing regions, formed at positions corresponding to the first adhesion fixing regions on surfaces of the pier portions. The adhesive agent causes the first adhesion fixing regions and the second adhesion fixing regions to adhere to each other. A restoring force acts on the adhesive agent in a case where the adhesive agent is melted. The surface-emitting laser substrate and the microlens substrate are self-aligned with each other according to the restoring force.

13 Claims, 13 Drawing Sheets

(51) Int. Cl.
  *G02B 7/00* (2006.01)
  *G02B 3/00* (2006.01)
  *H01S 5/42* (2006.01)
  *G02B 19/00* (2006.01)

(52) U.S. Cl.
  CPC ............ *H01S 5/423* (2013.01); *G02B 3/0075* (2013.01); *G02B 19/0066* (2013.01); *H01S 5/02272* (2013.01); *H01S 5/02276* (2013.01)

(58) Field of Classification Search
  CPC ... G02B 7/008; G02B 19/0066; G02B 3/0075
  See application file for complete search history.

(56) References Cited

U.S. PATENT DOCUMENTS

| | | | |
|---|---|---|---|
| 7,324,717 B2 | 1/2008 | Chua et al. | |
| 7,590,159 B2 | 9/2009 | Jikutani et al. | |
| 7,720,125 B2 | 5/2010 | Jikutani et al. | |
| 7,746,912 B2 | 6/2010 | Motomura et al. | |
| 7,981,700 B2 | 7/2011 | Sato et al. | |
| 8,035,676 B2 | 10/2011 | Harasaka et al. | |
| 8,111,725 B2 | 2/2012 | Ishii et al. | |
| 8,208,511 B2 | 6/2012 | Sato et al. | |
| 8,340,148 B2 | 12/2012 | Jikutani et al. | |
| 8,483,254 B2 | 7/2013 | Harasaka et al. | |
| 8,594,146 B2 | 11/2013 | Jikutani et al. | |
| 8,649,407 B2 | 2/2014 | Harasaka et al. | |
| 8,697,459 B2 | 4/2014 | Adachi et al. | |
| 8,824,517 B2 | 9/2014 | Jikutani et al. | |
| 8,916,418 B2 | 12/2014 | Ishii et al. | |
| 8,958,449 B2 | 2/2015 | Harasaka et al. | |
| 2004/0086011 A1* | 5/2004 | Bhandarkar ......... | G02B 6/4206 372/50.21 |
| 2006/0093010 A1 | 5/2006 | Sekiya et al. | |
| 2012/0281293 A1* | 11/2012 | Gronenborn ....... | B23K 26/0608 359/619 |
| 2013/0235377 A1 | 9/2013 | Ishii et al. | |
| 2015/0023381 A1 | 1/2015 | Ishii et al. | |

FOREIGN PATENT DOCUMENTS

| | | | | |
|---|---|---|---|---|
| JP | 2005-014141 | 1/2005 | | |
| JP | 2006-202998 | 8/2006 | | |
| JP | 2007-142425 | 6/2007 | | |
| JP | 4985772 | * 7/2012 | ............. | H04J 14/02 |
| WO | WO 2009/001461 A1 | 12/2008 | | |

* cited by examiner

SURFACE-EMITTING LASER APPARATUS AND MANUFACTURING METHOD THEREOF

BACKGROUND OF THE INVENTION

1. Field of the Invention

The disclosures herein generally relate to a surface-emitting laser apparatus and a manufacturing method thereof.

2. Description of the Related Art

Recently, intensive investigations have started on high-power lasers, for such as various kinds of optical instruments, laser projectors or light source lasers for laser processing machines. Such high-power lasers have achieved high output by focusing light from surface-emitting laser arrays, for example. A surface-emitting laser is suitable for a light source of a high-power laser according to a characteristic that light is emitted in a direction orthogonal to a substrate, a characteristic of easy integration and a characteristic of being easily testable. As a configuration of the high-power laser, for example, a configuration has been known in which a collimator lens including a microlens array is arranged in a light emission direction of a surface-emitting laser array which is a light source and furthermore a light focusing lens is arranged.

A surface-emitting laser array has a configuration, in which surface-emitting lasers each having a mesa structure several tens of micrometers square as a unit element are arranged in a square lattice shape or in a hexagonal closed packed lattice shape. On the other hand, a microlens array for generating collimator light from the light emitted from the surface-emitting laser array is made of synthetic quartz or the like and is formed corresponding to the unit element of the surface-emitting laser array.

The configurations of the surface-emitting laser array and the microlens array, as described above, requires high mounting accuracy of ±tens of micrometers in three directions of X, Y and Z for mounting the microlens on the surface-emitting laser in order to improve utilization efficiency of light of the surface-emitting laser. Then, various investigations for improving accuracy of mounting a microlens on a surface-emitting laser have been performed. Specific examples in the related art of aligning a microlens with a surface-emitting laser with high accuracy are as follows:

The first example in the related art of aligning a microlens with a surface-emitting laser is a photonic device. The photonic device is a device in which the surface-emitting laser and the microlens are integrated. The photonic device has a microlens structure, in which plural leg portions are provided on a substrate on which the surface-emitting laser is formed in order to keep a predetermined distance from the surface-emitting laser.

In the photonic device, as described above, mounting with high accuracy in the Z-direction is possible by fixing the leg portions, which are integrated with the microlens structure and are extended, on a surface of the substrate on which the surface-emitting laser is formed. Meanwhile, for aligning in the XY-directions, two kinds of positioning methods, i.e. positioning while monitoring images of the surface-emitting laser and of the lens and positioning while causing the surface-emitting laser to emit light and receiving light having transmitted through the lens, are disclosed (See, for example, Japanese Published Patent Application No. 2007-142425).

The second example in the related art of aligning a microlens with a surface-emitting laser is an optical element mounting apparatus. In the optical element mounting apparatus, in order to make it possible to align with high accuracy in the X, Y and Z directions, a protrusion of an alignment reference portion is integrally formed on one side of a microlens array substrate. Then, a depression of the alignment reference portion is integrally formed on one side of a surface-emitting laser array substrate. By engaging both the alignment reference portions, the mounting with high accuracy is possible.

Meanwhile, in the above-described optical element mounting apparatus, the protrusion on the side of the microlens is formed integrally with the microlens upon resin molding of the microlens, and the depression on the substrate on the side of the surface-emitting laser array is manufactured with high accuracy by etching using a photolithography technology of a semiconductor process. According to the above, mounting accuracy after assembly is guaranteed (See, for example, Japanese Published Patent Application No. 2004-288713).

The third example in the related art of aligning a microlens with a surface-emitting laser is a surface-emitting type light source. In the surface-emitting type light source, a microlens is formed corresponding to each surface-emitting laser, which is a unit element, on a surface-emitting laser array substrate. Meanwhile, by molding dielectric material such as $SiO_2$ film formed on a surface of the surface-emitting laser into a microlens by photolithography technology, the microlens makes it possible to align the surface-emitting laser and the microlens with high accuracy during manufacture (See, for example, Japanese Published Patent Application No. 2002-26452).

However, the first example of the related art has a problem that, in order to implement the above-described two kinds of positioning methods, a complicated and expensive mounting apparatus is required and a mounting takt is slow. That is, it is difficult to align a microlens on a surface-emitting laser with high accuracy by a simple method.

Moreover, in the second example of the related art, since a height of the protrusion and a depth of the depression are less than or equal to a thickness of the substrate at most, the height of the protrusion and the depth of the depression are less than or equal to several hundreds of micrometers. That is, the height of the protrusion is quite low, and the depth of the depression is quite shallow. There is a problem that they are easily misaligned. Accordingly, the microlens is required to be fixed on the surface-emitting laser by using adhesive agent, brazing material or the like. There is a problem that misalignment of the lens may occur in the process. That is, it is difficult to align a microlens with a surface-emitting laser with high accuracy by this method.

Moreover, the third example of the related art has a lot of technical problems for implementing. Since a microlens is formed of dielectric material or the like directly on a surface-emitting laser array substrate, reliability of the surface-emitting laser may be degraded according to a stress from the dielectric material in the microlens substrate or the like. That is, practical realization of aligning a microlens with a surface-emitting laser with high accuracy by this method is difficult.

The present invention has been made in view of the above, and has an object to provide a surface-emitting laser apparatus or the like in which a microlens is aligned with a surface-emitting laser with high accuracy by a simple method.

SUMMARY OF THE INVENTION

It is a general object of at least one embodiment of the present invention to provide a surface-emitting laser apparatus and a manufacturing method thereof that substantially obviate one or more problems caused by the limitations and disadvantages of the related art.

In one embodiment, a surface-emitting laser apparatus includes a surface-emitting laser substrate; a microlens substrate; and adhesive agent. The surface-emitting laser substrate includes a semiconductor substrate; and a surface-emitting laser configured to emit light and a plurality of first adhesion fixing regions formed on a first face of the semiconductor substrate. The microlens substrate includes a microlens configured to receive light emitted by the surface-emitting laser; a plurality of pier portions protruding toward a side of the first face of the semiconductor substrate; and a plurality of second adhesion fixing regions, formed at positions corresponding to the plurality of first adhesion fixing regions on surfaces of the pier portions on the side of the first face of the semiconductor substrate. The adhesive agent causes the first adhesion fixing regions and the second adhesion fixing regions to adhere to each other. A restoring force acts on the adhesive agent in a case where the adhesive agent is melted. The surface-emitting laser substrate and the microlens substrate are self-aligned with each other according to the restoring force.

In another embodiment, a manufacturing method of a surface-emitting laser apparatus includes forming a surface-emitting laser configured to emit light on a first face of a semiconductor substrate; forming a plurality of first adhesion fixing regions on the first face of the semiconductor substrate, to form a surface-emitting laser substrate; forming a microlens configured to receive light emitted by the surface-emitting laser on a transparent substrate; forming a plurality of pier portions on the transparent substrate; forming a plurality of second adhesion fixing regions at positions corresponding to the first adhesion fixing regions on surfaces of the pier portions, to form a microlens substrate; providing an adhesive agent on each of the first adhesion fixing regions or on each of the second adhesion fixing regions; arranging the microlens substrate on the surface-emitting laser substrate so that the second adhesion fixing regions correspond to the first adhesion fixing regions via the adhesive agent; melting the adhesive agent, on which a restoring force acts, the surface-emitting laser substrate and the microlens substrate being self-aligned with each other according to the restoring force; and cooling the adhesive agent, to fix the microlens substrate to the surface-emitting laser substrate.

According to the embodiment of the present application, a surface-emitting laser apparatus or the like in which a microlens is aligned with a surface-emitting laser with high accuracy by a simple method can be provided.

BRIEF DESCRIPTION OF THE DRAWINGS

Other objects and further features of embodiments will be apparent from the following detailed description when read in conjunction with the accompanying drawings, in which.

DESCRIPTION OF THE PREFERRED EMBODIMENTS

Figure 1:
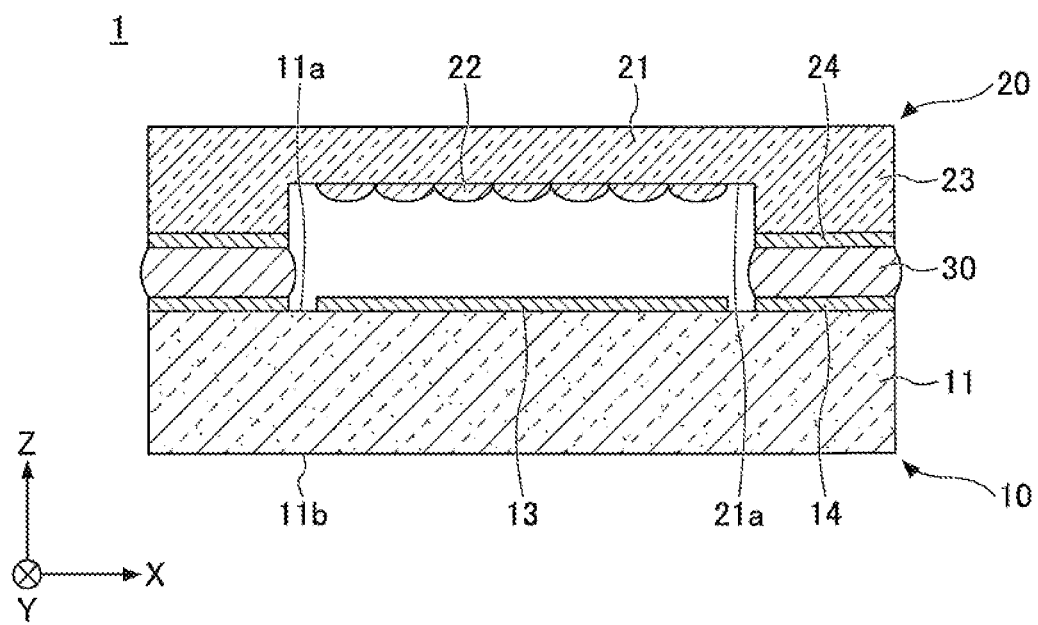
FIG. 1 is a cross-sectional diagram illustrating an example of a main part of a surface-emitting laser apparatus according to a first embodiment of the present invention.

In the following, embodiments of the present invention will be described with reference to the accompanying drawings. Meanwhile, in the present specification and drawings, the same reference numeral is assigned to the same component, and duplicate explanation will be omitted.

First Embodiment

Configuration of Surface-Emitting Laser Apparatus

FIG. 1 is a cross-sectional diagram illustrating an example of a main part of a surface-emitting laser apparatus according to a first embodiment of the present invention. As shown in FIG. 1, outline of the surface-emitting laser apparatus 1 includes a surface-emitting laser array substrate 10, a microlens array substrate 20 and an adhesive agent 30. The microlens array substrate 20 is mounted on the surface-emitting laser array substrate 10 via the adhesive agent 30. Moreover, the surface-emitting laser array substrate 10 may be mounted on a surface of a heat sink (not shown), for example.

Meanwhile, in the present embodiment, for the sake of convenience, the side of the microlens array substrate 20 will be called "upper side" or "one side", and the side of the surface-emitting laser array substrate 10 will be called "lower side" or "other side". Moreover, a surface of each site on the side of the microlens array substrate 20 will be called "one face" or "top face", and a surface on the side of the surface-emitting laser array substrate 10 will be called "other face" or "bottom face". However, the surface-emitting laser apparatus 1 can be used in a vertically inverted state, or may be arranged with an arbitrary angle. Moreover, in the present embodiment, "planar view" means viewing an object in a normal direction of a one face 11a of a semiconductor substrate 11, which will be described later, and "planar shape" means a shape of the object viewed in the normal direction of the one face 11a of the semiconductor substrate 11, which will be described later.

Moreover, in the respective drawings, the normal direction of the one face 11a of the semiconductor substrate 11 will be called "Z-direction", a direction parallel to a side of the one face 11a of the semiconductor substrate 11 in the planar view will be called "X-direction", and a direction orthogonal to the X-direction and the Z-direction will be called "Y-direction".

Figure 2A:
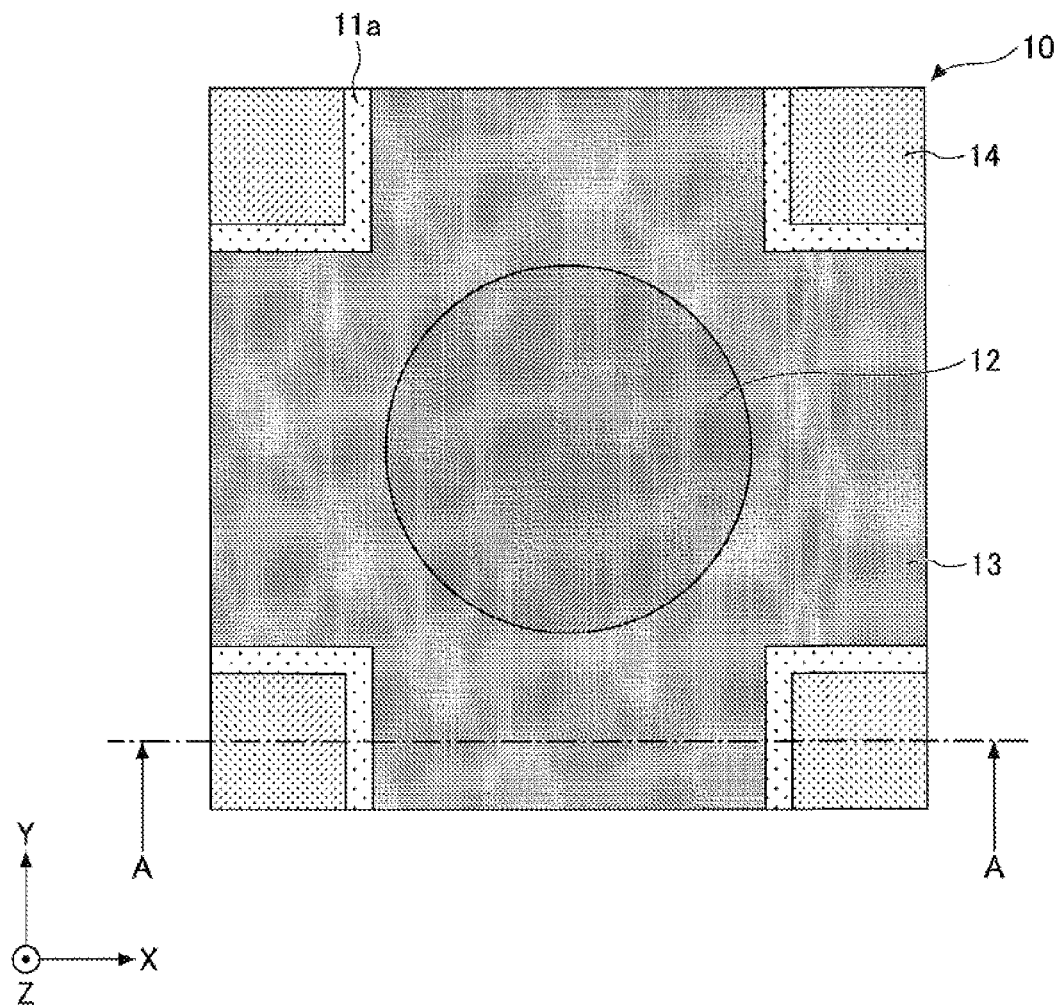
FIGS. 2A and 2B are diagrams illustrating an example of a surface-emitting laser array substrate according to the first embodiment.
Figure 2B:
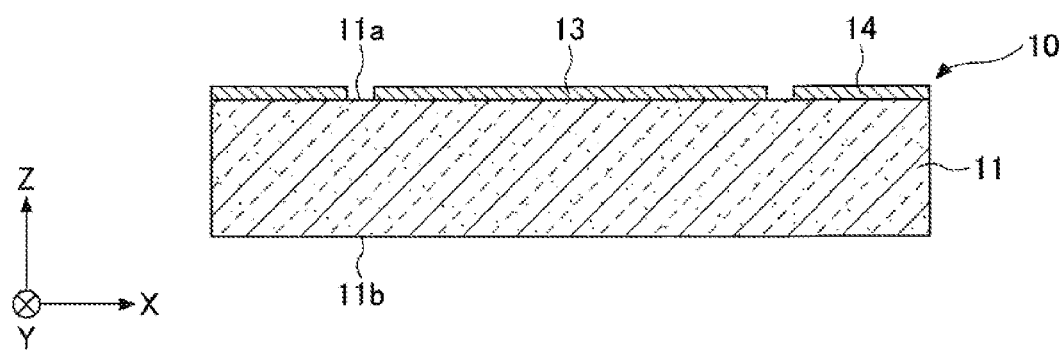

Here, with reference to FIGS. 2A to 3B, the surface-emitting laser array substrate 10 and the microlens array substrate 20 will be explained in detail. FIGS. 2A and 2B are diagrams illustrating an example of the surface-emitting laser array substrate according to the first embodiment. FIG. 2A is a plan view and FIG. 2B is a cross-sectional view cut along a line A-A in FIG. 2A. Meanwhile, in the plan view of FIG. 2A, for the sake of convenience, each component will be shown with a satin pattern (the same also in the other plan views).

In the surface-emitting laser array substrate 10, in an approximately central part of one face 11a (top face) of the semiconductor substrate 11 configured with an n-type gallium arsenide (GaAs) or the like, a surface-emitting laser array 12 is formed. In the surface-emitting laser array 12, plural surface-emitting lasers (not shown), each having a mesa structure and being a unit element, are arranged one-dimensionally or two-dimensionally in an array shape. A planar shape of the semiconductor substrate 11 is, for example, a quadrangle. The surface-emitting laser (not shown) is, for example, a vertical cavity surface-emitting laser (VCSEL), which emits light in a direction orthogonal to the semiconductor substrate 11 (Z-direction).

In the surface-emitting laser array substrate 10, on one face 11a of the semiconductor substrate 11, an anode electrode 13 which is an extension of an anode electrode of the respective surface-emitting laser (not shown) that is a unit element of the surface-emitting laser array 12 is formed. Moreover, on another face 11b (bottom face) of the semiconductor substrate 11, a cathode electrode (not shown) is formed.

Moreover, in a corner of the one face 11a of the semiconductor substrate 11, for example, an adhesion fixing region 14 is formed. A height from the one face 11a of the semiconductor substrate 11 to a top face of the adhesion fixing region 14 is almost the same as a height from the one face 11a of the semiconductor substrate 11 to an emitting point of the surface-emitting laser. The adhesion fixing region 14 is a representative example of a first adhesion fixing region according to the present embodiment. Meanwhile, the corner of the one face 11a of the semiconductor substrate 11 means a neighbor of a corner part of the one face 11a of the semiconductor substrate 11, and the adhesion fixing region 14 does not necessarily have to be arranged so as to contact a margin of the one face 11a of the semiconductor substrate 11.

A planar shape of the adhesion fixing region 14 can be, for example, a square. The adhesion fixing region 14 can be formed, for example, with gold (Au). The adhesion fixing region 14 may be formed, for example, with laminated films, in which titanium (Ti)/platinum (Pt)/gold (Au) are laminated in the order from a side of the one face 11a of the semiconductor substrate 11. However, the adhesion fixing region 14 may be formed of a material other than the above-described material, in the case where it is a material which becomes wet with the adhesive agent 30 more easily than the material of the semiconductor substrate 11 (for example, gallium arsenide).

Meanwhile, since the semiconductor substrate 11 has low electric conductivity, the anode electrode 13 and the adhesion fixing region 14 which are formed so as to be separated from each other on the one face 11a of the semiconductor substrate 11 are insulated electrically from each other. In order to insulate more firmly the anode electrode 13 and the adhesion fixing region 14 from each other, an insulation film may be formed on the one face 11a of the semiconductor substrate 11 and the adhesion fixing region 14 may be formed on it.

Figure 3A:
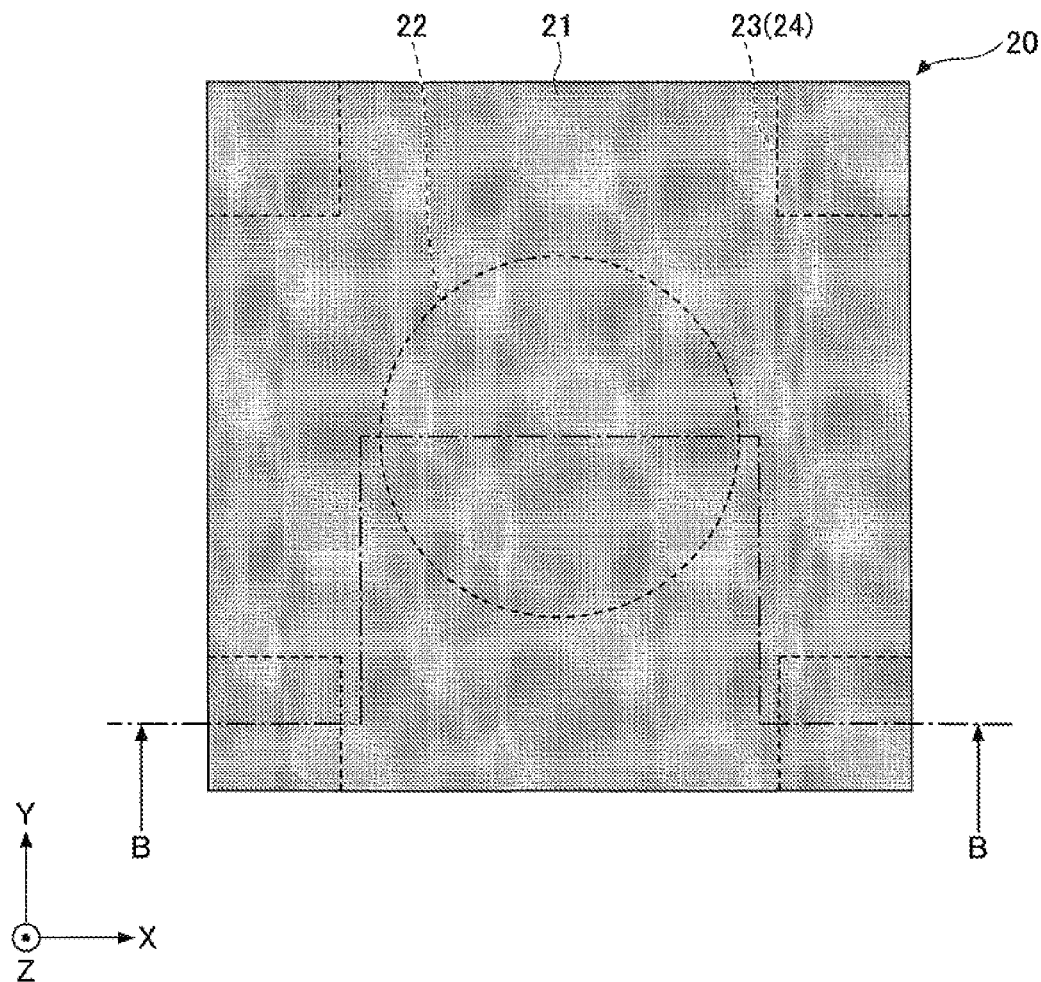
FIGS. 3A and 3B are diagrams illustrating an example of a microlens array substrate according to the first embodiment.
Figure 3B:
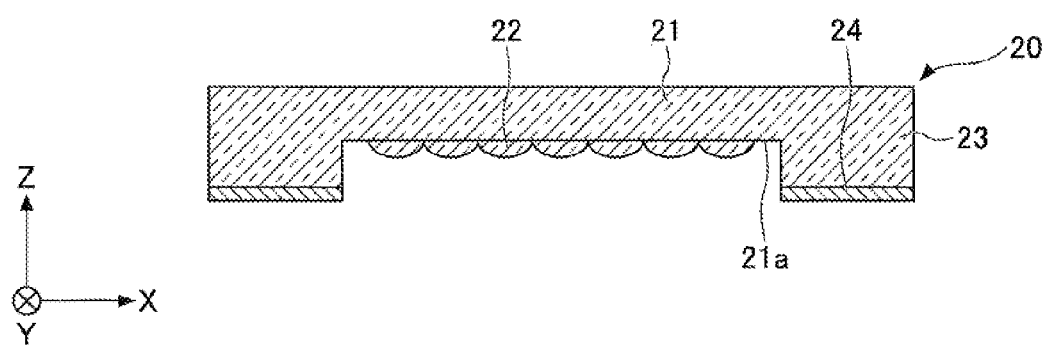

FIGS. 3A and 3B are diagrams illustrating an example of the microlens array substrate according to the first embodiment. FIG. 3A is a plan view and FIG. 3B is a cross-sectional view cut along a line B-B in FIG. 3A.

In the microlens array substrate 20, on a transparent substrate 21 made of synthetic quartz or the like, a microlens array 22 is formed. Each microlens of the microlens array 22 configuration is arranged at a position corresponding to the respective surface-emitting laser (not shown) which is a unit element of the surface-emitting laser array 12. Output light from each surface-emitting laser (not shown), which is a unit element, enters a corresponding microlens, and parallel light is emitted.

In a corner of an opposite surface 21a of the transparent substrate 21 which is a surface opposed to the surface-emitting laser array substrate 10, a pier portion 23 for defining a distance from the surface-emitting laser array substrate 10 is formed extended from the transparent substrate 21. On the bottom face of the pier portion 23, an adhesion fixing region 24 is formed. The adhesion fixing region 24 is a representative example of a second adhesion fixing region according to the present embodiment. Meanwhile, each adhesion fixing region 24 does not necessarily have to be formed in a whole surface of the bottom face of the pier portion 23, if it is formed at a position opposed to the corresponding adhesion fixing region 14.

A planar shape of the adhesion fixing region 24 is preferably the same as the planar shape of the adhesion fixing region 14. The adhesion fixing region 24 may be formed of the same material as that of the adhesion fixing region 14. However, the adhesion fixing region 24 may be formed of a material other than the above-described material, in the case where it is a material which becomes wet with the adhesive agent 30 more easily than the material of the pier portion 23 (the same as the material of the transparent substrate 21).

In this way, the microlens array substrate 20 is provided with the microlens array 22, which output lights from the respective surface-emitting lasers. The lights enter the plural pier portions 23 which protrude on the side of the one face 11a of the semiconductor substrate 11, and the adhesion fixing regions 24 formed on the bottom faces of the respective pier portions 23.

Meanwhile, in the examples of FIGS. 1, 3A and 3B, the microlens array 22 is formed on the opposite surface 21a of the transparent substrate 21 (surface on which the pier portions 23 are formed). However, the microlens array 22 does not necessarily have to be formed on the opposite surface 21a. For example, the microlens array 22 may be formed on a surface opposed to the opposite surface 21a of the transparent substrate 21.

Returning to FIG. 1, the adhesion fixing region 14 of the surface-emitting laser array substrate 10 adheres to the adhesion fixing region 24 of the microlens array substrate 20, which is opposed to the adhesion fixing region 14, via a bump including the adhesive agent 30. For the adhesive agent 30, an adhesive agent including gold having a great surface tension as a main component such as Au—Sn (20 wt %) can be preferably used. However, as the adhesive agent 30, a generally used lead-free solder material such as Sn—Cu, Sn—Sb, Sn—Ag, or Sn—Bi may be used.

Meanwhile, for a material including flux, upon adhering, the flux may be spread on the microlens array 22 or the like and may cause decrease in the amount of light. Then, a process of cleaning the flux after adhesion is necessary. By using a material which does not include flux, such as Au—Sn, the process of cleaning flux becomes unnecessary, and the manufacturing process can be simplified.

The surface-emitting laser array substrate 10 and the microlens array substrate 20 are fixed in a self-aligned state according to restoring force which occurs upon the adhesive agent 30 melting. Meanwhile, the self-alignment will be explained later in detail in the description of a manufacturing method of the surface-emitting laser apparatus 1.

Positional accuracies in a planar direction and in a height direction (a horizontal direction and a vertical direction) of each of the surface-emitting lasers of the surface-emitting laser array substrate 10 and of each of the microlenses of the microlens array substrate 20 in the self-alignment can be about ±1 µm, respectively.

Meanwhile, in FIG. 1, for the sake of convenience, a cross section corresponding to FIG. 2 for the surface-emitting laser array substrate 10 is shown, and a cross section corresponding to FIG. 3 for the microlens array substrate 20 is shown.

[Manufacturing Method of Surface-Emitting Laser Apparatus]

Figure 4A:
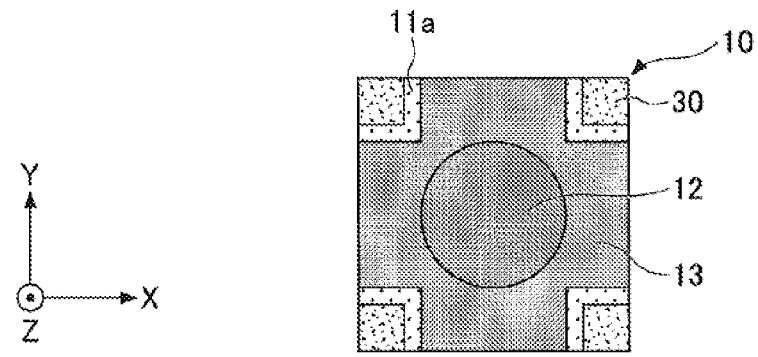
FIGS. 4A and 4B are diagrams illustrating an example of a manufacturing process of the surface-emitting laser apparatus according to the first embodiment.

FIGS. 4A to 7B are diagrams illustrating an example of the manufacturing method of the surface-emitting laser apparatus according to the first embodiment. At first, as shown in FIG. 4A, a surface-emitting laser array 12 is formed in an approximately central part of the one face 11a of the semiconductor substrate 11, and furthermore, plural adhesion fixing regions 14 are formed in corners of the one face 11a of the semiconductor substrate 11 using metals, and thereby the surface-emitting laser array substrate 10 is manufactured. Then, Au—Sn (20 wt %) is arranged as the adhesive agent 30 on the adhesion fixing regions 14 in the corners of the one face 11a of the semiconductor substrate 11 of the surface-emitting laser array substrate 10, manufactured as above. A predetermined amount of Au—Sn (20 wt %) is arranged on the adhesion fixing region 14 by using a vacuum deposition method, for example. An appropriate amount of Au—Sn (20 wt %) foil may be cut and arranged on the adhesion fixing region 14.

Meanwhile, a configuration of the surface-emitting laser array substrate 10 has been explained with reference to FIGS. 2A and 2B. In order to form the surface-emitting laser array 12, at first, a semiconductor substrate 11 is prepared. Then, for example, on one face 11a of the semiconductor substrate 11, a lower distributed Bragg reflector (DBR), a lower spacer layer, a multiple quantum well active layer, an upper spacer layer, an upper DBR and a contact layer are laminated and formed sequentially by epitaxial growth or the like.

Then, by etching the laminated and formed semiconductor layers of a predetermined region in a direction orthogonal to the one face 11a of the semiconductor substrate 11, a mesa structure is formed, and an insulation layer is formed on a side surface of the mesa structure and on the etched region. According to the above, the surface-emitting laser array 12 is formed, which emits laser light in the Z-direction from an emission surface open on a top face of the mesa structure.

Moreover, the adhesion fixing region 14 can be provided, for example, by forming a film of gold (Au) or the like on the one face 11a of the semiconductor substrate 11 by using the vacuum deposition method, an electron beam (EB) deposition method or the like. The adhesion fixing region 14 may be formed, for example, by laminating titanium (Ti)/platinum (Pt)/gold (Au) in series from the side of the one face 11a of the semiconductor substrate 11 by using the vacuum deposition method, the electron beam (EB) deposition method or the like.

Incidentally, in order to achieve alignment with high accuracy by the self-alignment in the post process, it is important to enhance positional accuracies of each emitting point (mesa structure) of the surface-emitting laser array 12 and of each of the adhesion fixing regions 14. In order to form a mesa structure by etching, a mask is required. Moreover, in order to form the adhesion fixing region 14 by using the vacuum deposition method or the like, another mask is required (The anode electrode 13 is formed with the same mask). That is, each emitting point (mesa structure) of the surface-emitting laser array 12 and each adhesion fixing region 14 require high positional accuracy determined by aligning accuracy for the two masks.

Figure 4B:
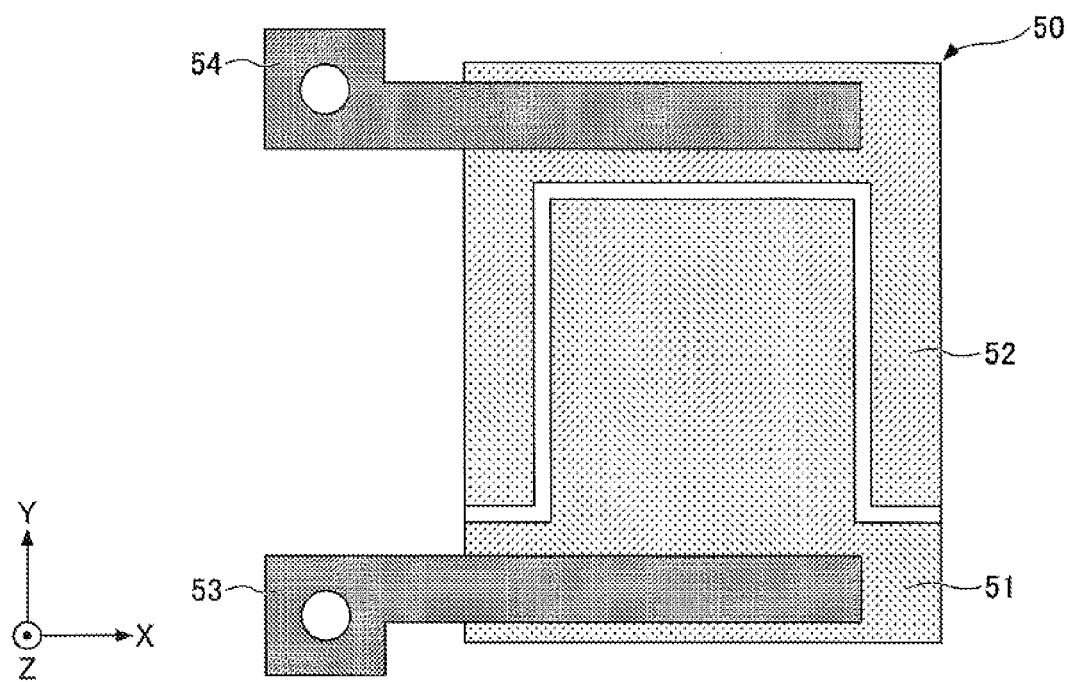

Next, as shown in FIG. 4B, a heat sink substrate 50 for mounting the surface-emitting laser array substrate 10 is prepared. The heat sink substrate 50 is insulative. On the surface of the heat sink substrate 50 are formed, a wiring pattern 51 for mounting a cathode electrode of the surface-emitting laser array substrate 10 and a wiring pattern 52 for performing wire bonding for the anode electrode 13. Moreover, to the wiring pattern 51 an electric current terminal 53 is connected, and to the wiring pattern 52 an electric current terminal 54 is connected. The wiring patterns 51 and 52 can be formed of, for example, gold (Au) or the like. Moreover, the electric current terminals 53 and 54 can be formed of, for example, copper (Cu) or the like. Meanwhile, the electric current terminals 53 and 54 may be formed in the post process.

Figure 5A:
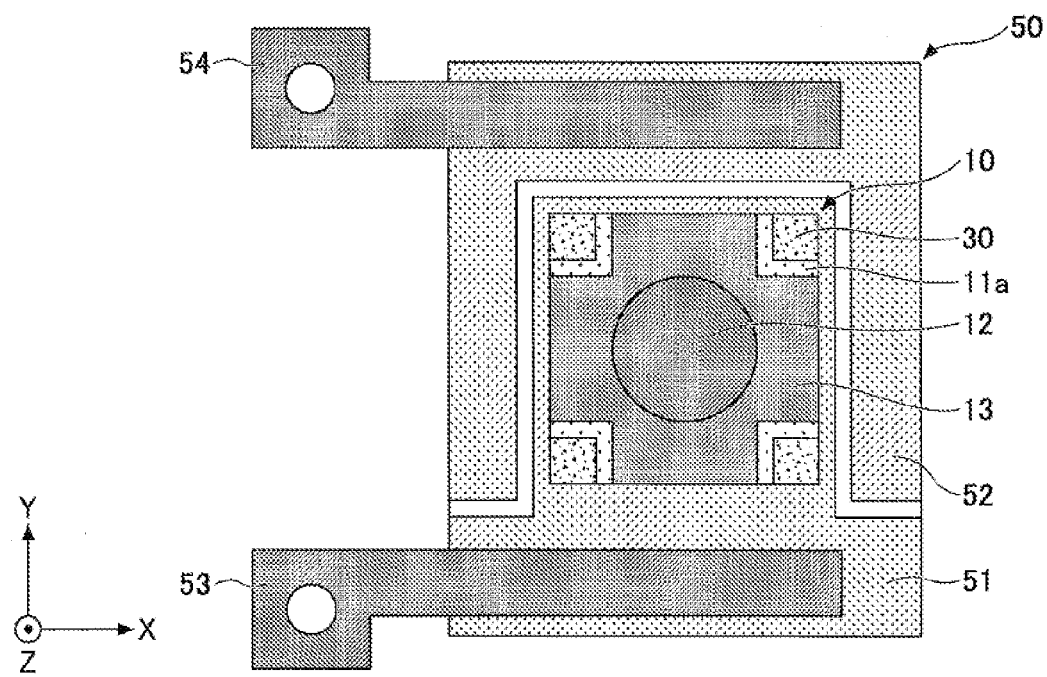
FIGS. 5A and 5B are diagrams illustrating another example of the manufacturing process of the surface-emitting laser apparatus according to the first embodiment.
Figure 5B:
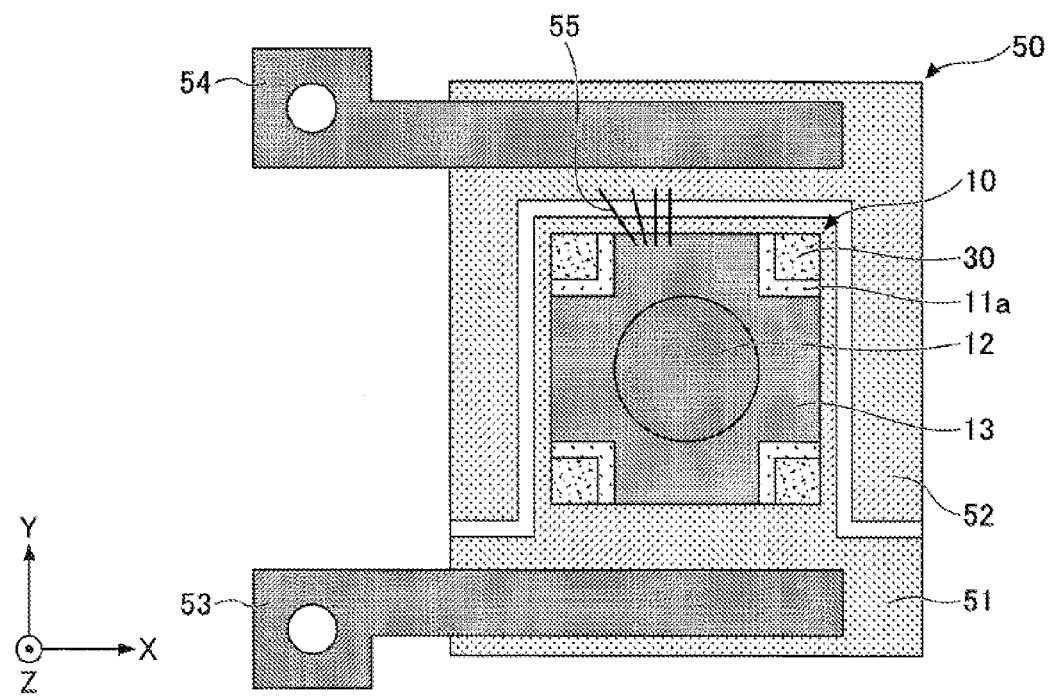

Next, as shown in FIG. 5a, the surface-emitting laser array substrate 10, in which adhesive agent 30 is arranged on the adhesion fixing regions 14, is die-bonded to the wiring pattern 51 of the heat sink substrate 50 by a die-bond agent. Next, as shown in FIG. 5B, the anode electrode 13 of the die-bonded surface-emitting laser array substrate 10 is wire-bonded to the wiring pattern 52 of the heat sink substrate 50 by using a metal wire 55. For the metal wire 55, for example, a gold wire, a copper wire or the like may be used.

Figure 6A:
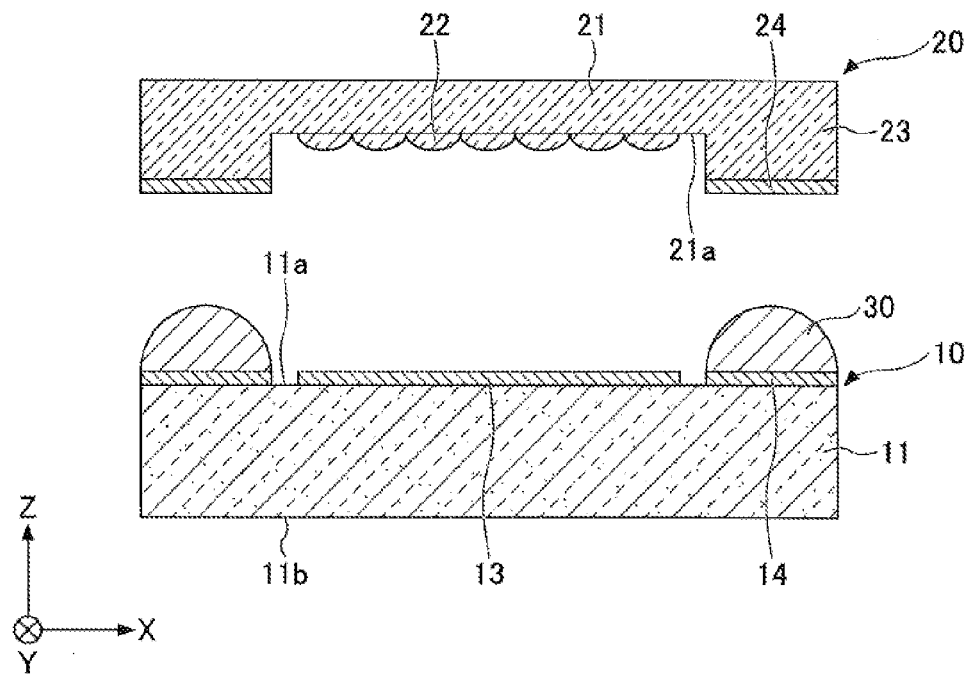
FIGS. 6A and 6B are diagrams illustrating yet another example of the manufacturing process of the surface-emitting laser apparatus according to the first embodiment.

Next, as shown in FIG. 6A, a microlens array substrate 20 is manufactured. Then, the manufactured microlens array substrate 20 is kept in the air by vacuum tweezers, and is put into a state of being movable precisely in the XY-directions (horizontal direction). In FIGS. 6A to 7A, only the surface-emitting laser array substrate 10, the microlens array substrate 20 and the adhesive agent 30 are shown, and other components have been omitted.

Meanwhile, a configuration of the microlens array substrate 20 has been explained with reference to FIGS. 3A and 3B. The microlens array 22 and the pier portions 23 can be formed using quartz by well-known method combining photolithography and etching. Moreover, the adhesion fixing regions 24 can be formed by the same method and using the same material as the adhesion fixing regions 14.

Incidentally, in order to achieve alignment with high accuracy by the self-alignment in the post process, it is important to enhance positional accuracies of each microlens of the microlens array 22 and of each of the adhesion fixing regions 24. In order to form a microlens by etching, a mask is required. Moreover, in order to form the adhesion fixing region 24 by using vacuum deposition method or the like, another mask is required. That is, each microlens of the microlens array 22 and each adhesion fixing region 24 require high positional accuracy determined by aligning accuracy for the two masks.

Figure 6B:
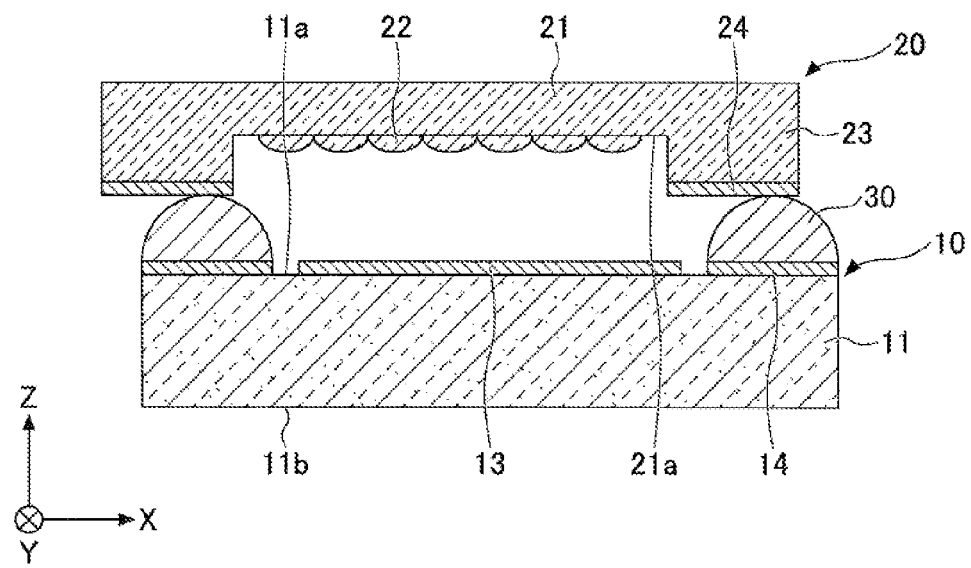

Next, as shown in FIG. 6B, the microlens array substrate 20 which has been kept in the air is positioned and the adhesion fixing regions 24 of the microlens array substrate 20 are arranged so as to be located at positions opposed to the respective adhesion fixing regions 14 of the surface-emitting laser array substrate 10 via the adhesive agent 30. At this time, a position gap may exist between the microlens array substrate 20 and the surface-emitting laser array substrate 10.

Figure 7A:
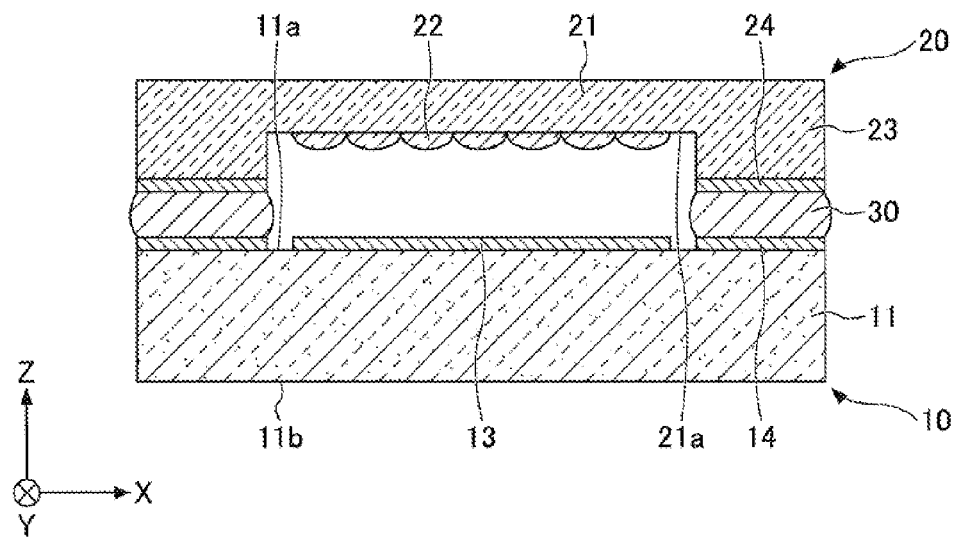
FIGS. 7A and 7B are diagrams illustrating still another example of the manufacturing process of the surface-emitting laser apparatus according to the first embodiment.
Figure 7B:
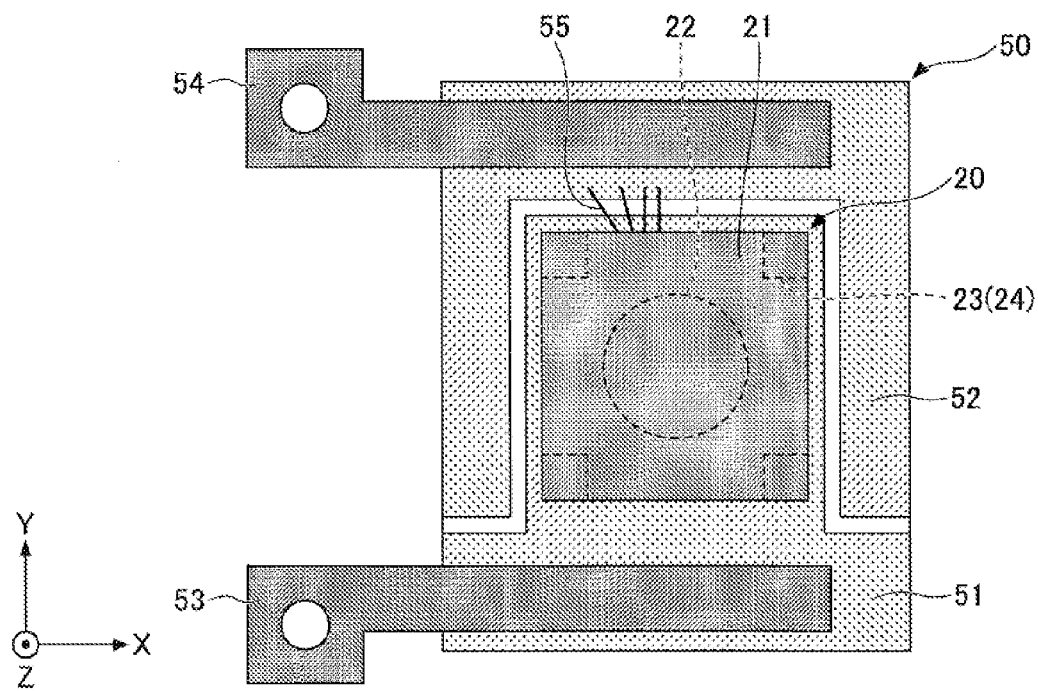

Next, as shown in FIGS. 7A and 7B, the microlens array substrate 20 is die-bonded to the surface-emitting laser array substrate 10 via the adhesive agent 30. Meanwhile, FIG. 7A is a cross section illustrating only the surface-emitting laser array substrate 10, the microlens array substrate 20 and adhesive agent 30. FIG. 7B is a plan view illustrating the whole surface-emitting laser apparatus 1 which is mounted on the heat sink substrate 50.

Specifically, for example, Au—Sn (20 wt %) which forms the adhesive agent 30 is heated more than or equal to 280° C. in a nitrogen atmosphere and melted. The melted Au—Sn (20 wt %) spreads in the adhesion fixing region 14 of the surface-emitting laser array substrate 10 and in the adhesion fixing region 24 of the microlens array substrate 20.

At this time, according to a restoring force of the melted Au—Sn (20 wt %), a self-alignment occurs, and the microlens array substrate 20 is aligned with the surface-emitting laser array substrate 10 with high accuracy. Moreover, by making amounts of Au—Sn (20 wt %) arranged respectively between the adhesion fixing regions 14 and the adhesion fixing regions 24 uniform, positional accuracy in the height direction can be secured.

Afterwards, through a cooling process, the mounting of the microlens array substrate 20 ends. That is, the surface-emitting laser array substrate 10 and the microlens array substrate 20 are self-aligned with each other according to the restoring force of the melted adhesive agent 30, and afterwards fixed in the state of being aligned with high accuracy by the coagulating adhesive agent 30.

Positional accuracies in a planar direction and in a height direction (a horizontal direction and a vertical direction) of the surface-emitting lasers of the surface-emitting laser array substrate 10 and the respective microlenses of the microlens array substrate 20 in the self-alignment can be about ±1 μm, respectively. Meanwhile, "about ±1 μm" is a value including a position gap between the emitting points of the surface-emitting laser array 12 and the adhesion fixing regions 14 determined by aligning accuracy for the above-described two masks, and including a position gap between each microlens of the microlens array 22 and the adhesion fixing regions 24.

In the process shown in FIGS. 7A and 7B, upon melting the adhesive agent 30, only the adhesive agent 30 is preferably heated locally rather than heating all of the surface-emitting laser array substrate 10, the microlens array substrate 20 and the adhesive agent 30. The reason is to prevent thermal stress arising from a difference in coefficients of thermal expansion between the microlens array substrate 20 (for example, quartz) and the semiconductor substrate 11 of the surface-emitting laser array substrate 10 (for example, gallium arsenide) from remaining in the semiconductor substrate 11.

For example, a heating apparatus, which deflects laser light emitted from the laser light source by a Galvano mirror and irradiates adhesive agents 30 at four sites repeatedly and serially, can be used. Plural light sources may be used, and plural Galvano mirrors may be used. Accordingly, the adhesive agents 30 at four sites are heated locally and at the same time, and thereby the above-described problem caused by the difference in coefficients of thermal expansion can be prevented.

Meanwhile, in the above explanation, usage of an Au—Sn deposited film or the like for an adhesive agent for which an effect of self-alignment is expected is exemplified. For the adhesive agent 30, Au—Sn paste may be used. A manufacturing process in the case of using Au—Sn paste for the adhesive agent 30 will be briefly explained as follows. Meanwhile, the Au—Sn paste includes flux.

First, the Au—Sn paste is spread on a predetermined plane into a uniform thickness. Next, the adhesion fixing region 24 of the microlens array substrate 20 is brought into contact with the Au—Sn paste spread in a uniform thickness, and thereby the Au—Sn paste is uniformly transferred to the adhesion fixing region 24. Then, thermal treatment of more than or equal to 280° C. in a nitrogen atmosphere is performed, and the Au—Sn paste transferred on the adhesion fixing region 24 is hardened. Next, flux remaining in the adhesion fixing region 24 is cleaned using cleaning liquid.

Next, the microlens array substrate 20 in which the Au—Sn paste is transferred on the adhesion fixing region 24 is arranged at a predetermined position of the surface-emitting laser array substrate 10. In order to prevent Sn from oxidizing, the Au—Sn paste is melted by heating again in a nitrogen atmosphere, and afterwards is hardened. On this occasion, according to self-alignment, the surface-emitting laser array substrate 10 and the microlens array substrate 20 are fixed in a state of being aligned with high accuracy. The positional accuracy of the self-alignment is the same as the case where the Au—Sn deposited film or the like is used.

Figure 8:
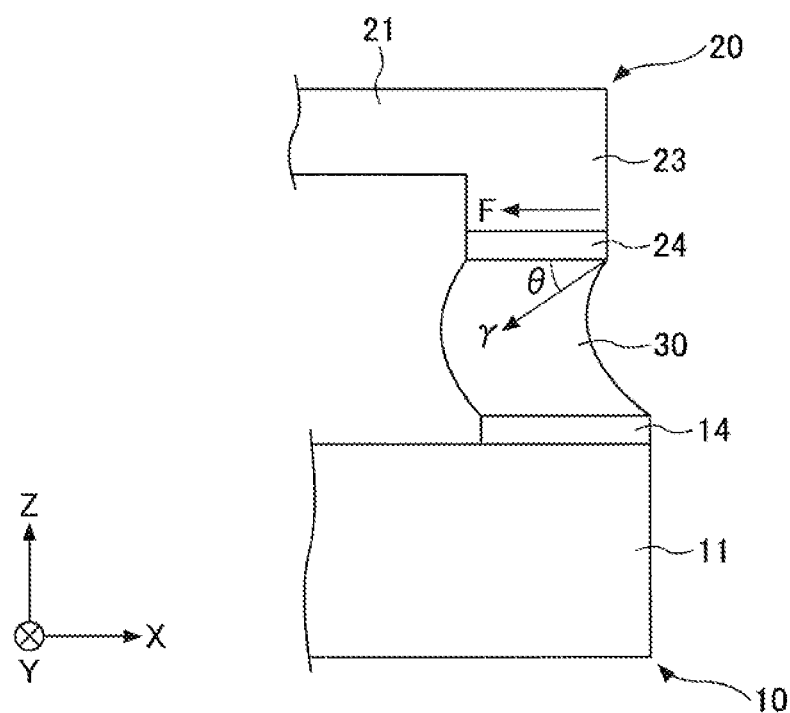
FIG. 8 is a diagram for explaining a principle of performing a self-alignment.

Here, a principle of the self-alignment performed in the process shown in FIG. 7A and FIG. 7B will be explained. FIG. 8 is an enlarged cross-sectional diagram of a part in a vicinity of the melted adhesive agent 30. As shown in FIG. 8, a restoring force F acts on the melted and liquefied adhesive agent 30 according to surface tension. By the restoring force F, the microlens array substrate 20 is self-aligned.

Afterwards, through a cooling process, the mounting of the microlens array substrate 20 ends. That is, the surface-emitting laser array substrate 10 and the microlens array substrate 20 are self-aligned with each other according to the restoring force of the melted adhesive agent 30, and afterwards fixed in the state of being aligned with high accuracy by the coagulating adhesive agent 30.

The restoring force F acts so that contact angles are the same according to a surface tension of the spread melted adhesive agent 30. Specifically, the restoring force F can be expressed by the following formula (1):

$$F = L \times \gamma \times \cos \theta \tag{1}$$

where L represents a length of a side which is wet with the adhesive agent 30, θ represents the contact angle and γ is the surface tension. As shown in formula (1), the longer the length L of the side which is wet with the adhesive agent 30 is, the greater the surface tension γ is or the smaller the contact angle θ is, the greater a value of the restoring force F that the microlens array substrate 20 receives is. Accordingly, the shape of the region which is wet with the adhesive agent 30 (planar shape of the adhesion fixing regions 14 and 24) is preferably a shape of a square, a rectangle or a combination of a square and a rectangle, rather than a circle.

Second Embodiment

In a second embodiment, an example of a surface-emitting laser apparatus in which a planar shape of an adhesion fixing region is different from that in the first embodiment will be described. Meanwhile, in the second embodiment, an explanation for the same component as that in the embodiment which has already been explained may be omitted.

Described as above, the planar shape of the region which is wet with the adhesive agent 30 is preferably a square, a rectangle or a combination of a square or a rectangle rather than a circle. In the first embodiment, the planar shape of the adhesion fixing region 14 is a square, but in a surface-emitting laser array substrate 10A shown in FIG. 9, a planar shape of an adhesion fixing region 14A is a rectangle. Then, the adhesion fixing regions 14A arranged in corners have a pattern of repeating alternately vertically long and horizontally long along an outer shape of the semiconductor substrate 11.

That is, the adhesion fixing regions 14A arranged in the corners are arranged in a positional relationship in which long sides of adjacent adhesion fixing regions 14A are orthogonal to each other. In other words, the adhesion fixing regions 14A arranged in the corners are arranged in a positional relationship in which long sides of diagonal adhesion fixing regions 14A are parallel to each other. Meanwhile, though it is not shown, an adhesion fixing region of the microlens array substrate is formed in a planar shape corresponding to the adhesion fixing region 14A (i.e. a rectangle), and is arranged at a position corresponding to the adhesion fixing region 14A.

Figure 9:
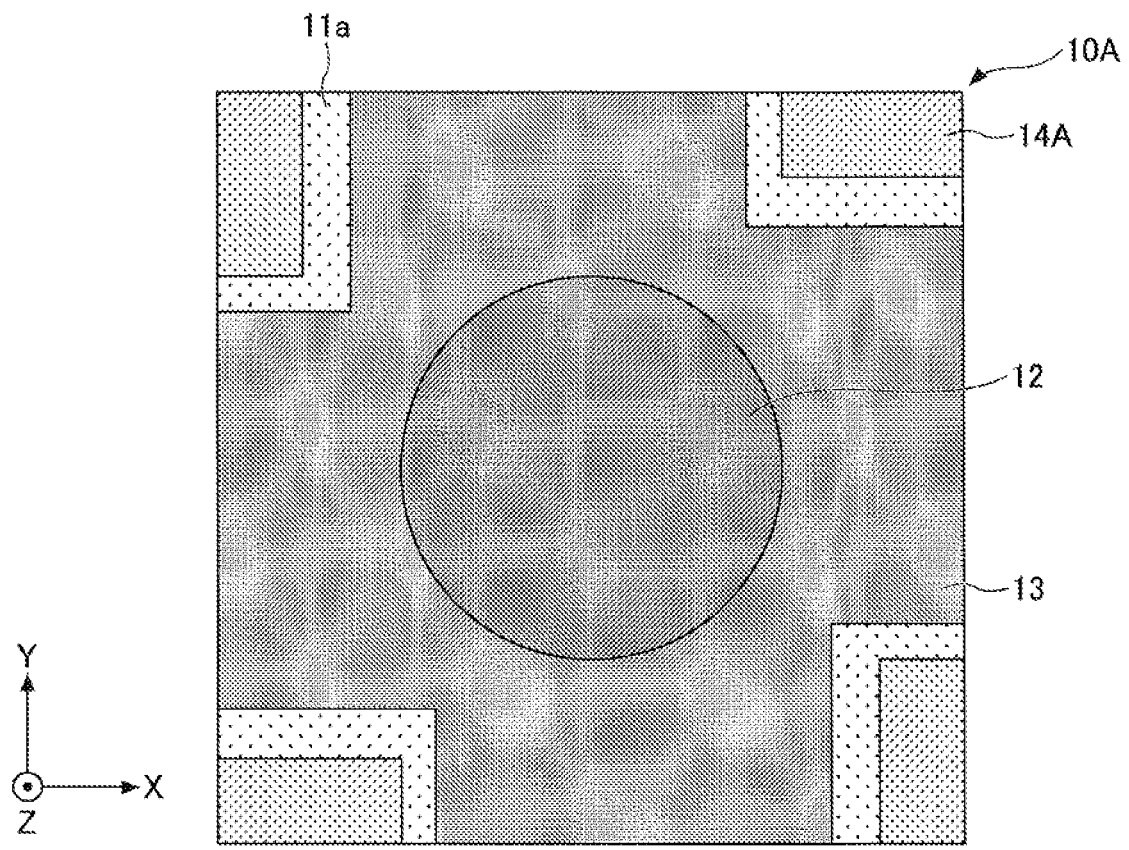
FIG. 9 is a plan view illustrating an example of a surface-emitting laser array substrate according to a second embodiment.

According to formula (1), the restoring force F acts more in the direction of the long side. Then, according to the arrangement of the adhesion fixing regions 14A, as shown in FIG. 9, the restoring forces F that the microlens array substrate receives upon the self-alignment from the adjacent adhesive agent 30 are orthogonal to each other. As a result, for rotational deviation between the microlens array substrate 20 and the surface-emitting laser array substrate 10A, an effective alignment is possible.

Third Embodiment

In a third embodiment, another example of a surface-emitting laser apparatus in which a planar shape of an adhesion fixing region is different from that in the first embodiment will be described. Meanwhile, in the third embodiment, an explanation for the same component as that in the embodiment which has already been explained may be omitted.

Described as above, the planar shape of the region which is wet with the adhesive agent 30 is preferably a square, a rectangle or a combination of a square or a rectangle rather than a circle. In the first embodiment, the planar shape of the adhesion fixing region 14 is a square, and in the second embodiment, the planar shape of the adhesion fixing region 14A is a rectangle. On the other hand, in a surface-emitting laser array substrate 10B shown in FIG. 10, a planar shape of an adhesion fixing region 14B is an L-shape (a shape where a square and a rectangle are combined). Then, the adhesion fixing regions 14B arranged in corners have a pattern in which an inner side of the L-shape faces a center of the semiconductor substrate 11. A longitudinal part and a lateral part of the L-shape may be the same length.

Meanwhile, though it is not shown, an adhesion fixing region of the microlens array substrate is formed in a planar shape corresponding to the adhesion fixing region 14B (i.e. an L-shape), and is arranged at a position corresponding to the adhesion fixing region 14B.

Figure 10:
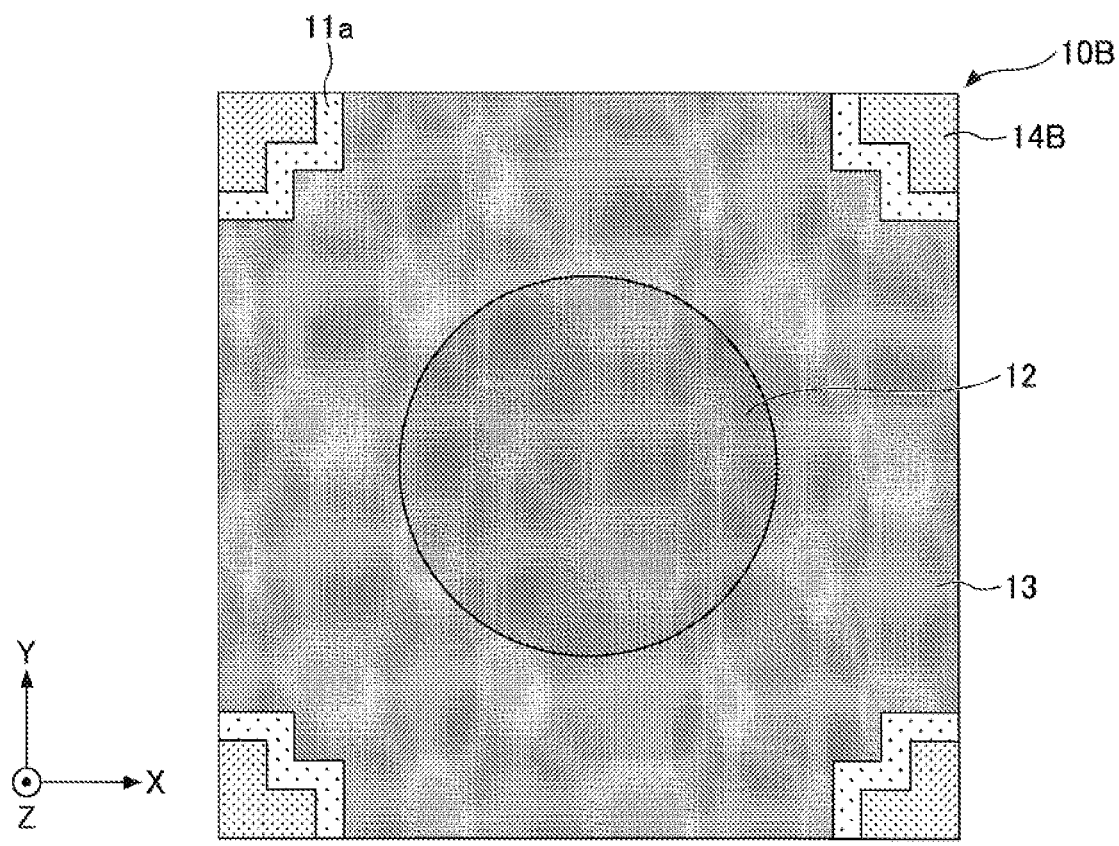
FIG. 10 is a plan view illustrating an example of a surface-emitting laser array substrate according to a third embodiment.

According to the arrangement of the adhesion fixing regions 14B, as shown in FIG. 10, the restoring force F that the microlens array substrate receives upon the self-alignment from the adjacent adhesive agent 30 includes an orthogonal component and a parallel component. As a result, for rotational deviation and X-Y direction deviation between the microlens array substrate and the surface-emitting laser array substrate 10B, an effective alignment is possible.

Fourth Embodiment

In a fourth embodiment, an example of a surface-emitting laser apparatus in which a shape of a microlens array substrate is different from that in the first embodiment will be described. Meanwhile, in the fourth embodiment, an explanation for the same component as that in the embodiment which has already been explained may be omitted.

Figure 11A:
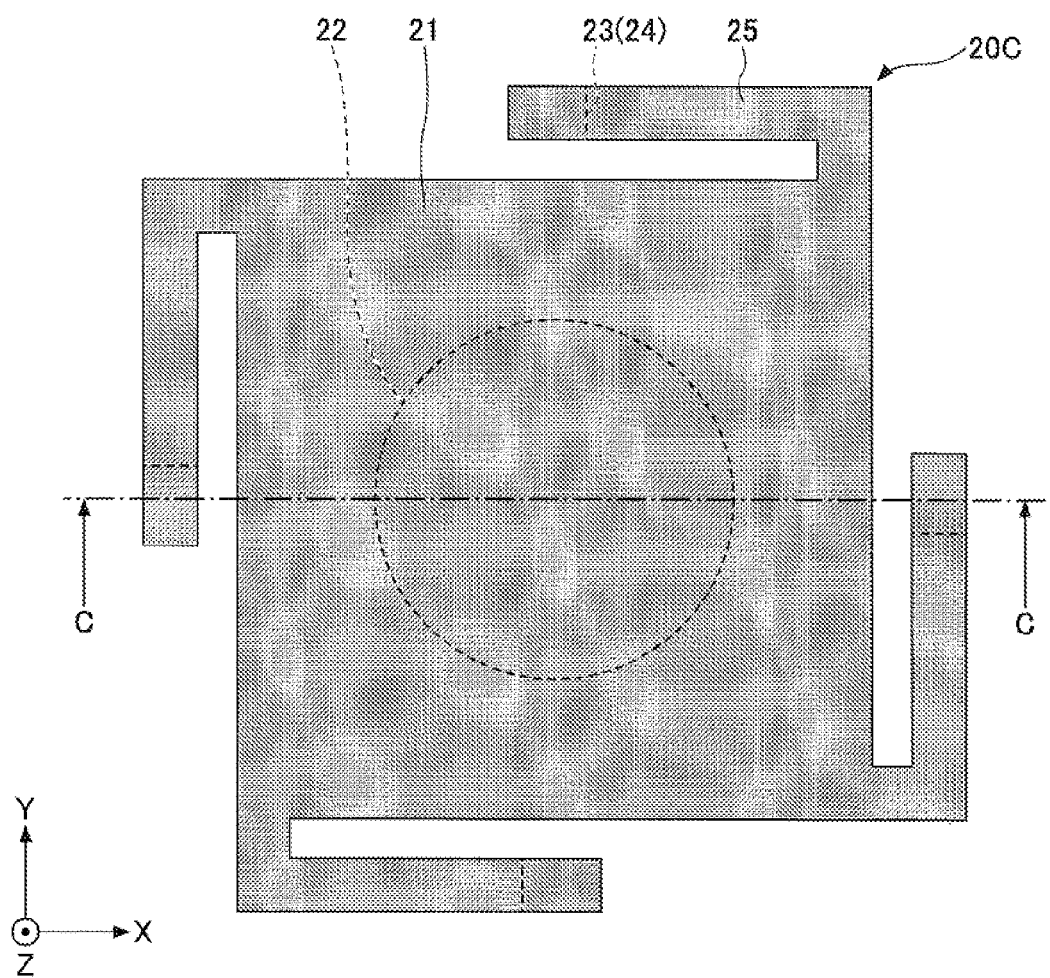
FIGS. 11A and 11B are diagrams illustrating an example of a microlens array substrate according to a fourth embodiment.
Figure 11B:
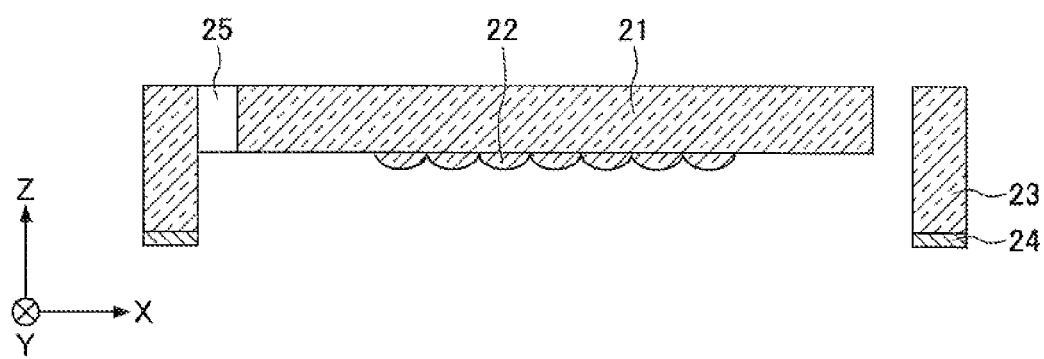

FIGS. 11A and 11B are diagrams illustrating an example of the microlens array substrate according to the fourth embodiment. FIG. 11A is a plan view and FIG. 11B is a cross-sectional diagram cut along line C-C in FIG. 11A.

The microlens array substrate is configured with, for example, quartz. The semiconductor substrate of the surface-emitting laser array substrate is configured with, for example, gallium arsenide. Therefore, in the case where the microlens array substrate is adhered to the surface-emitting laser array substrate by an adhesive agent, there is concern about the possibility that thermal stress arising from a difference in coefficients of thermal expansion between the microlens array substrate and the surface-emitting laser array substrate remains in the semiconductor substrate.

Then, in the microlens array substrate 20C shown in FIGS. 11A and 11B, hinges 25 which extend in a direction parallel to the one face 11a of the semiconductor substrate 11 from four corners of the transparent substrate 21 (a part where the microlens array 22 is formed) are provided.

The planar shape of the hinge 25 may be, for example, an L-shape. In this case, the respective hinges 25 may be arranged so that, in a planar view, lateral parts of the L-shapes are connected to the corners of the transparent substrate 21, respectively, and longitudinal parts of the L-shapes are parallel to the sides of the transparent substrate 21, to which the lateral parts are connected, via predetermined intervals. The respective hinges 25 may be arranged, in a planar view, so as to be rotationally symmetric.

At an end of the longitudinal part of the L-shape of the hinge 25, a pier portion 23 protruding to the side of the one face 11a of the semiconductor substrate 11 is formed extending in the Z-direction. On the bottom face of the pier portion 23, an adhesion fixing region 24 is formed. Meanwhile, though it is not shown, an adhesion fixing region of the surface-emitting laser array substrate is formed in a planar shape corresponding to the adhesion fixing region 24 of the microlens array substrate 20C, and is arranged at a position corresponding to the adhesion fixing region 24.

In this way, by supporting the microlens array substrate 20C by the hinges 25 at four sites, thermal stress upon adhering can be relieved. A stress arising from a difference in coefficients of thermal expansion and remaining in the semiconductor substrate of the surface-emitting laser array substrate can be reduced.

Fifth Embodiment

In a fifth embodiment, an example of a surface-emitting laser apparatus in which an opening section is provided in an adhesion fixing region of a microlens array substrate will be described. Meanwhile, in the fifth embodiment, an explanation for the same component as that in the embodiment which has already been explained may be omitted.

Figure 12:
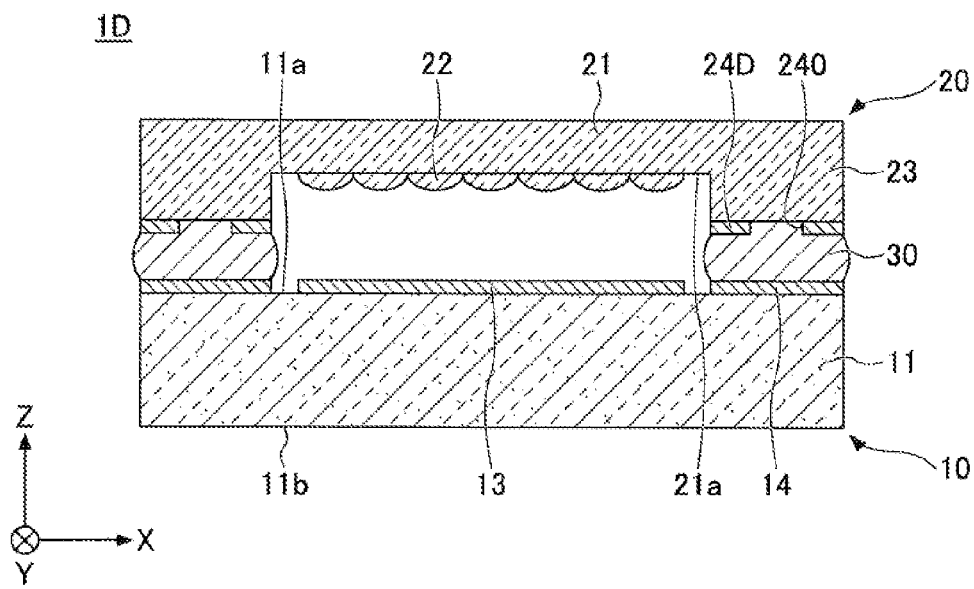
FIG. 12 is a cross-sectional diagram illustrating an example of a main part of a surface-emitting laser apparatus according to a fifth embodiment.

FIG. 12 is a cross-sectional diagram illustrating an example of a main part of the surface-emitting laser apparatus according to the fifth embodiment. As shown in FIG. 12, the surface-emitting laser apparatus 1D is different from the surface-emitting laser apparatus 1 (See FIG. 1) in that an adhesion fixing region 24D is provided in the bottom face of the pier portion 23 of the microlens array substrate 20 instead of the adhesion fixing region 24. The adhesion fixing region 24D is provided with an opening section 240 which penetrates through the adhesion fixing region 24D in the thickness direction.

Figure 13A:
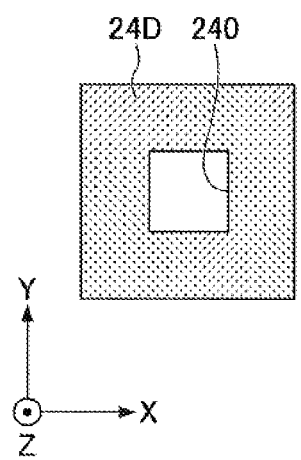
FIGS. 13A to 13C are plan views illustrating examples of an adhesion fixing region of the surface-emitting laser apparatus according to the fifth embodiment.
Figure 13B:
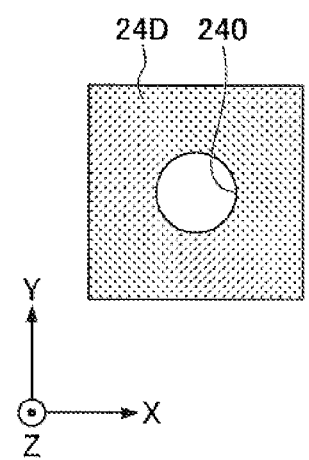
Figure 13C:
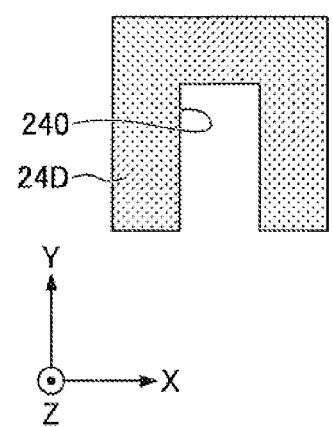

FIGS. 13A to 13C are plan views illustrating examples of the adhesion fixing region in the surface-emitting laser apparatus according to the fifth embodiment. As shown in FIG. 13A, a planar shape of the opening section 240 may be, for example, a square or a rectangle. Moreover, as shown in FIG. 13B, the planar shape of the opening section 240 may be, for example, a circle or an ellipse. Furthermore, as shown in FIG. 13C, the opening section 240 may be caused to reach an end, and thereby the planar shape of the adhesion fixing region 24D is a U-shape.

Furthermore, the planar shape of the opening section 240 may be a more complicated shape, other than those shown in FIGS. 13A to 13C, such as a shape in which a square and a circle are combined. Moreover, plural opening sections 240 may be provided in an adhesion fixing region 24D, such as two circular openings. Moreover, in this case, the plural opening sections 240 may have different shapes, respectively, such as a mixture of a square opening and a circular opening.

Figure 14A:
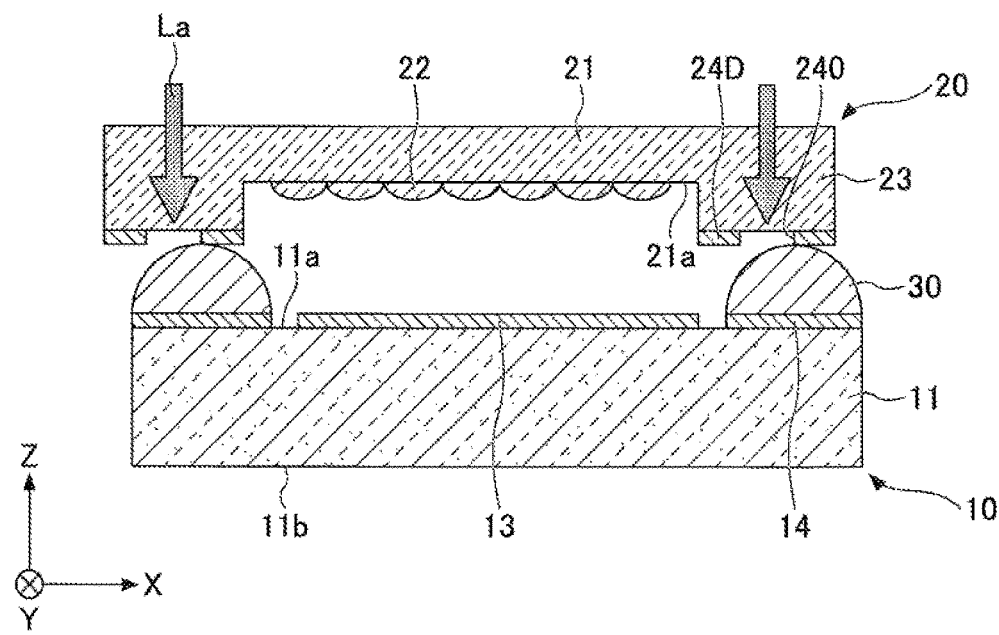
FIGS. 14A and 14B are diagrams illustrating an example of a manufacturing process of the surface-emitting laser apparatus according to the fifth embodiment.
Figure 14B:
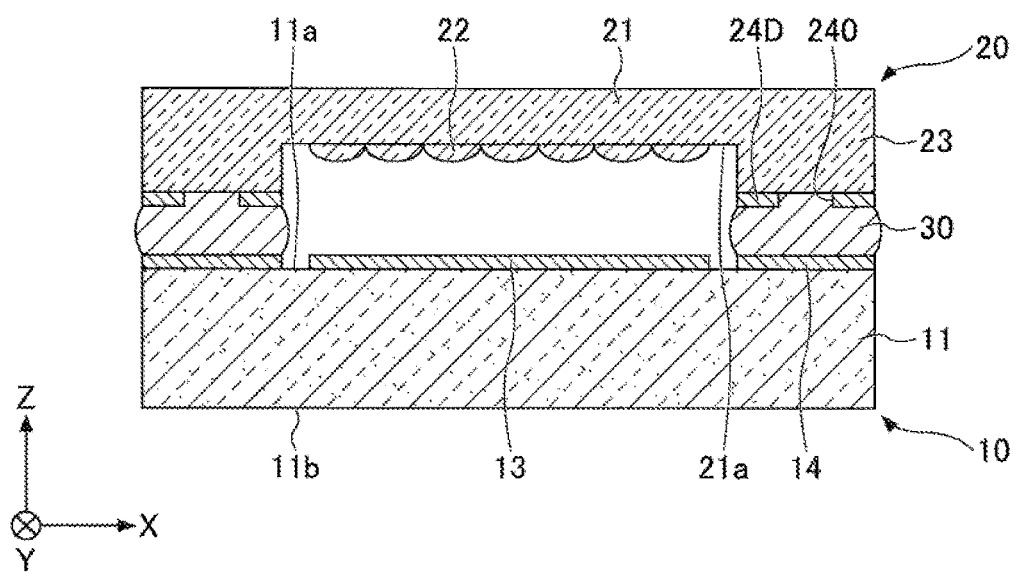

Next, with reference to FIGS. 14A and 14B, technical meaning of providing the opening section 240 in the adhesion fixing region 24D will be explained. FIGS. 14A and 14B are diagrams illustrating an example of a manufacturing process of the surface-emitting laser apparatus according to the fifth embodiment.

Described as above, upon melting the adhesive agent 30, only the adhesive agent 30 is preferably heated locally. For example, a method of irradiating the adhesive agent 30 with laser light may be employed.

Incidentally, in the first embodiment, in the case of heating the adhesive agent 30 (solder, Au—Sn or the like) locally with laser light, a method of making laser light be incident on the adhesion fixing region 24 from a side of the transparent microlens array substrate 20 can be considered. However, in the case of making laser light be incident on the adhesion fixing region 24 from the side of the microlens array substrate 20, reflection is great. It is expected that in order to melt the adhesive agent 30, greater energy will be required than the case of making laser light incident directly on the adhesive agent 30.

In this case, at first, laser light heats the adhesion fixing region 24. Next, heat is transferred from the adhesion fixing region 24 to the adhesive agent 30 which is on the lower side, and thereby the adhesive agent 30 is melted. Therefore, in a state where the adhesive agent 30 is melted, temperature of the adhesion fixing region 24 becomes greater than or equal to the melting point of the adhesive agent 30, and thermal stress may increase.

In the present embodiment, in order to melt the adhesive agent 30 by laser light more effectively, the adhesion fixing region 24D provided with the opening section 240 is arranged in the microlens array substrate 20 instead of the adhesion fixing region 24 so that laser light is directly transmitted to the adhesive agent 30.

By providing the opening section 240 in the adhesion fixing region 24D, as shown in FIG. 14A, laser light La emitted from the heating apparatus passes from the side of the microlens array substrate 20 through the opening section 240 of the adhesion fixing region 24D, and is transmitted directly to the adhesive agent 30. As a result, the adhesive agent 30 can be melted effectively. Moreover, by providing the opening section 240 in the adhesion fixing region 24D, since length of interface with the adhesive agent increases, it is expected that the surface tension will increase.

According to the above configuration, as shown in FIG. 14B, the surface-emitting laser array substrate 10 and the microlens array substrate 20 are self-aligned with each other according to the restoring force of the melted adhesive agent 30, and afterwards fixed in the state of being aligned with high accuracy by the coagulating adhesive agent 30.

In this way, in the fifth embodiment, since the adhesion fixing region 24D of the microlens array substrate 20 is provided with the opening section 240, the adhesive agent 30 can be melted effectively by laser light. Then, temperature rise in the microlens array substrate 20 can be suppressed and the thermal stress decreases. Furthermore, a length of an interface between the adhesion fixing region 24D and the adhesive agent 30 increases and surface tension increases, and thereby accuracy of self-alignment is improved.

Further, the present invention is not limited to these embodiments, but various variations and modifications may be made without departing from the scope of the present invention.

For example, in the above-described embodiment, the surface-emitting laser apparatus provided with the surface-emitting laser array substrate and the microlens array substrate is explained. However, the present invention can be applied to a surface-emitting laser apparatus provided with a surface-emitting laser substrate and a microlens substrate. That is, the surface-emitting laser apparatus according to the present invention may be provided with a surface-emitting laser or may be provided with plural surface-emitting lasers, and may be provided with a microlens or may be provided with plural microlenses.

The present application is based on and claims the benefit of priority of Japanese Priority Applications No. 2014-163639 filed on Aug. 11, 2014 and No. 2014-209081 filed on Oct. 10, 2014 the entire contents of which are hereby incorporated by reference.

What is claimed is:

1. A surface-emitting laser apparatus comprising:
a surface-emitting laser substrate including:
  a semiconductor substrate;
  a surface-emitting laser array including plural surface-emitting laser unit elements that each emit light,
  the surface-emitting laser array having been formed on a first face of the semiconductor substrate; and
  a plurality of first adhesion fixing regions on said first face of the semiconductor substrate;
a microlens substrate including:

a microlens array including plural microlens elements disposed at respective positions corresponding to the respective surface-emitting laser unit elements of the surface-emitting laser array to receive light emitted by the respective surface-emitting laser unit elements of the surface-emitting laser array, each microlens element of the microlens array having a convex surface facing towards the respective surface-emitting laser unit element;

a plurality of pier portions protruding toward the first face of the semiconductor substrate; and a plurality of second adhesion fixing regions, facing the first face of the semiconductor substrate and being disposed on surfaces of the pier portions, at respective positions corresponding to the plurality of first adhesion fixing regions; and an adhesive agent that causes the first adhesion fixing regions and the second adhesion fixing regions to adhere to each other, and the surface-emitting laser substrate and the microlens substrate being directly bonded to each other via (i) the first adhesion fixing regions of the surface-emitting laser substrate, (ii) the adhesive agent and (iii) the second adhesion fixing regions of the microlens substrate.

2. The surface-emitting laser apparatus as claimed in claim 1, wherein the first adhesion fixing regions are formed of a material having a property of being wetted with the adhesive agent more easily than a material for forming the semiconductor substrate, and the second adhesion fixing regions are formed of a material having a property of being wetted with the adhesive agent more easily than a material for forming the pier portions.

3. The surface-emitting laser apparatus as claimed in claim 1, wherein the first adhesion fixing regions are formed in connection with the surface-emitting laser array, and the pier portions and the second adhesion fixing regions are formed in connection with the microlens array.

4. The surface-emitting laser apparatus as claimed in claim 3, wherein positional accuracy between an emitting point of the surface-emitting laser and the first adhesion fixing regions is determined by accuracy in alignment between a mask used in connection with the surface-emitting laser array and a mask used in connection with the first adhesion fixing regions.

5. The surface-emitting laser apparatus as claimed in claim 3, wherein positional accuracy between the microlens array and the second adhesion fixing regions is determined by accuracy in alignment between a mask used in connection with the microlens array and a mask used in connection with the second adhesion fixing regions.

6. The surface-emitting laser apparatus as claimed in claim 1, wherein a planar shape of the semiconductor substrate is a quadrangle, the first adhesion fixing regions are arranged in corners of the semiconductor substrate, a planar shape of each of the first adhesion fixing regions is a rectangle, the first adhesion fixing regions are arranged so that long sides of the rectangles of the adjacent first adhesion fixing regions are orthogonal to each other, and a planar shape of each of the second adhesion fixing regions is formed so as to correspond to the planar shape of each of the respective first adhesion fixing regions, and the second adhesion fixing regions are arranged at positions corresponding to the first adhesion fixing regions.

7. The surface-emitting laser apparatus as claimed in claim 1, wherein a planar shape of the semiconductor substrate is a quadrangle, the first adhesion fixing regions are arranged in corners of the semiconductor substrate, a planar shape of each of the first adhesion fixing regions is an L-shape, the first adhesion fixing regions are arranged so that an inner side of the L shape of each of the first adhesion fixing regions faces to a center of the semiconductor substrate, and a planar shape of each of the second adhesion fixing regions is formed so as to correspond to the planar shape of each of the respective first adhesion fixing regions, and the second adhesion fixing regions are arranged at positions corresponding to the first adhesion fixing regions.

8. The surface-emitting laser apparatus as claimed in claim 1, wherein a height from the first face of the semiconductor substrate to top faces of the first adhesion fixing regions is the same as a height from the first face of the semiconductor substrate to an emitting point of the surface-emitting laser unit elements.

9. The surface-emitting laser apparatus as claimed in claim 1, wherein an opening section is provided in each of the second adhesion fixing regions.

10. A surface-emitting laser apparatus comprising:
 a surface-emitting laser substrate including
  a semiconductor substrate; and
  a surface-emitting laser configured to emit light and
  a plurality of first adhesion fixing regions,
  the surface-emitting laser and the plurality of first adhesion fixing regions being formed on a first face of the semiconductor substrate;
 a microlens substrate including
  a microlens configured to receive light emitted by the surface-emitting laser;
  a plurality of pier portions protruding toward a side of the first face of the semiconductor substrate; and
  a plurality of second adhesion fixing regions, formed at positions corresponding to the plurality of first adhesion fixing regions on surfaces of the pier portions on the side of the first face of the semiconductor substrate; and
 an adhesive agent that causes the first adhesion fixing regions and the second adhesion fixing regions to adhere to each other,
 wherein the microlens substrate further includes a plurality of hinges which extend in a direction parallel to the first face of the semiconductor substrate from a part where the microlens is formed, and the pier portion which protrudes toward a side of the first face of the semiconductor substrate is formed at an end of each of the hinges.

11. A manufacturing method of a surface-emitting laser apparatus comprising:
 forming a surface-emitting laser array including plural surface-emitting laser unit elements that each emit light on a first face of a semiconductor substrate;
 forming a plurality of first adhesion fixing regions on the first face of the semiconductor substrate,
 a surface-emitting laser substrate including the semiconductor substrate and the surface-emitting laser array and the plurality of first adhesion fixing regions formed thereon;
 forming, on a transparent substrate, a microlens array including plural microlens elements disposed at positions corresponding to the respective surface-emitting laser unit elements to receive light emitted by the respective surface-emitting laser unit elements of the surface-emitting laser array, each microlens element of the microlens array having a convex surface facing towards the respective surface-emitting laser unit element;

forming a plurality of pier portions on the transparent substrate;

forming a plurality of second adhesion fixing regions at positions corresponding to the first adhesion fixing regions on surfaces of the pier portions, a microlens substrate including the transparent substrate, the microlens array and the pier portions formed on the transparent substrate, and the plurality of second adhesion fixing regions at positions corresponding to the first adhesion fixing regions formed on the pier portions;

providing an adhesive agent on each of the first adhesion fixing regions or on each of the second adhesion fixing regions;

arranging the microlens substrate on the surface-emitting laser substrate so that the second adhesion fixing regions correspond to the first adhesion fixing regions via the adhesive agent;

melting the adhesive agent; and cooling the adhesive agent, to fix the microlens substrate to the surface-emitting laser substrate, the surface-emitting laser substrate and the microlens substrate being directly bonded to each other via (i) the first adhesion fixing regions of the surface-emitting laser substrate, (ii) the adhesive agent and (iii) the second adhesion fixing regions of the microlens substrate.

12. The manufacturing method of the surface-emitting laser apparatus as claimed in claim 11, wherein the adhesive agent is melted by a heating apparatus to heat the adhesive agents locally and simultaneously.

13. The manufacturing method of the surface-emitting laser apparatus as claimed in claim 12, further comprising forming an opening section in the second adhesion fixing regions, wherein the heating apparatus emits laser light from a side of the microlens substrate, and the laser light emitted by the heating apparatus passes through the opening section in the second adhesion fixing regions and is transmitted to the adhesive agent, to melt the adhesive agent.

* * * * *